(12) United States Patent
Schinkowitsch

(10) Patent No.: US 6,681,142 B2
(45) Date of Patent: Jan. 20, 2004

(54) METHOD AND SYSTEM FOR TESTING A TEST PIECE

(75) Inventor: Bernhard Schinkowitsch, Jedenspeigen (AT)

(73) Assignee: Siemens Aktiengesellschaft, Vienna (AU)

( * ) Notice: Subject to any disclaimer, the term of this patent is extended or adjusted under 35 U.S.C. 154(b) by 217 days.

(21) Appl. No.: 09/798,242

(22) Filed: Mar. 2, 2001

(65) Prior Publication Data

US 2001/0021899 A1 Sep. 13, 2001

(30) Foreign Application Priority Data

Mar. 2, 2000 (AT) .............................................. 339/2000

(51) Int. Cl.⁷ ............................ G06F 13/00; G01R 31/28
(52) U.S. Cl. ........................ 700/108; 702/108; 702/119; 714/724; 700/79; 700/81
(58) Field of Search .................................. 702/108, 117, 702/118, 121; 714/724, 745; 324/73.1, 158.1; 700/1, 26, 39, 79, 81, 108–113

(56) References Cited

U.S. PATENT DOCUMENTS

| | | | | | |
|---|---|---|---|---|---|
| 5,036,479 A | * | 7/1991 | Prednis et al. | .............. | 702/121 |
| 5,184,312 A | * | 2/1993 | Ellis | ............................ | 702/121 |
| 5,278,565 A | * | 1/1994 | Horn | ........................... | 342/165 |
| 5,675,508 A | * | 10/1997 | Kapadia | ....................... | 714/736 |
| 5,832,418 A | * | 11/1998 | Meyer | ........................ | 702/119 |
| 6,356,094 B1 | * | 3/2002 | Tverdy et al. | .............. | 324/758 |
| 6,418,389 B2 | * | 7/2002 | Peter et al. | ................. | 702/108 |
| 6,536,006 B1 | * | 3/2003 | Sugamori | .................... | 714/724 |

FOREIGN PATENT DOCUMENTS

| | | |
|---|---|---|
| GB | 2 335 280 A | 11/1997 |
| JP | 0731 8614 A | 5/1994 |
| WO | 98/45720 | 10/1998 |

* cited by examiner

*Primary Examiner*—Leo Picard
*Assistant Examiner*—Douglas S. Lee
(74) *Attorney, Agent, or Firm*—Schiff Hardin & Waite

(57) ABSTRACT

A method and system for computerized testing of a test piece, wherein testing is implemented by individual test modules operating in parallel. As a result, the total testing time is shortened. A central control computer and the test modules communicate via a field bus system. Implementation of a test occurs at least partially in parallel with respect to time by means of at least two different test modules. Transmission of test orders from the central computer to a test module and acknowledgment messages from the test module to the central control computer are carried by the field bus system. As a result, necessary wiring outlay is low and any interferences that occur can be quickly localized and eliminated.

7 Claims, 1 Drawing Sheet

METHOD AND SYSTEM FOR TESTING A TEST PIECE

BACKGROUND OF THE INVENTION

1. Field of the Invention

The present invention generally relates to testing methods and systems for electronic devices. In particular, the present invention relates to computerized testing of mobile telephones.

2. Discussion of the Related Art

The increasing quality demands regarding technical devices, particularly electronic devices, as well as the ever increasing demand for such technical devices, has created a need for efficient test methods in order to determine the operativeness of the test pieces.

Since production of such devices is automatically carried out primarily, automatically running test methods are also desired. These methods are a part of a production process running on a production line, mostly at the end of the production process in order to determine the quality of the end product. Intermediate products can be potentially checked as well concerning their operativeness in order to eliminate rejected goods early from the production process.

The test methods can also be utilized for an individual testing position, whereby the test itself is carried out fully automatic, but the responsible quality control staff must arrange for feeding and carrying-off of test pieces to the test modules. This type of testing is primarily used for apparatuses which have been returned by the user to the manufacturer due to an error that has occurred during the operation.

As a result of the increasing complexity of the test pieces, it is often necessary to distribute the testing tasks to two or more test modules, which are optimally suitable for a specific part of the entire test due to their construction. This distribution, however, additionally requires utilization of a central control computer for assignment of test orders for the individual parts of the test to the respective test modules.

The test modules themselves comprise interfaces with respect to the input units and output units of the test pieces and are extremely versatile due to the large bandwidth of functions of technical devices.

Some examples of input units include: mechanical input units such as switches, keys, keyboards, touch screens; potentiometers or the like; radio receiver interfaces operating according to the GSM standard or DECT standard; optical input units such as an infrared receiver interface; acoustic input units such as microphones; electrical input units such as serial interfaces or parallel interfaces; optical input units, such as solar cells; and electrical input units, such as the load socket of a device operated by accumulators.

Some examples of output units include: mechanical output units such as printer heads or devices for Braille printing; radio transmitter interfaces operating according to the GSM standard or the DECT standard; optical output units such as an infrared transmitter interface; acoustic output units, primarily loudspeakers; and electrical output units, for example transmitters of serial interfaces or parallel interfaces; mechanical output units, such as a computer-controlled cutter head or milling head of a metals processing milling machine; and electrical output units, such as the output of a current inverter for transforming alternating current into direct-current.

It is expressively pointed out that, as a result of the versatileness of technical possibilities of the method and system of the present invention, the aforementioned are only an extract of conceivable input units and output units upon which the method and system of the present invention is useful on.

Test modules can comprise input units and output units at the same time, therefore transmitters and receivers of a bi-directional infrared transmission path, for example. In any case, a test module must always contain the proper counter-piece of the input unit or output unit present on the test piece. For example, when a microphone is provided on the test piece for the input unit, the test module must have a loudspeaker for testing this input unit. For example, when keyboards contained on the test piece are to be tested, rams that are pneumatically or electromagnetically operated and that operate the corresponding keys by a defined pressure are expedient.

It is known from WO 98/45720, which is directed to a test system and method, that electrical test pieces can be tested concerning their electrical functions. On the basis of a test rule to be fixed by the user, the test process is controlled by a control module, whereby the individual sub-tests, which are carried out by the test modules, are sequentially executed. The total duration of a test process therefore derives as sum of the times necessary for the respective sub-tests.

If the total duration for the function testing of a technical device is greater than the time necessary for its production, a plurality of testing positions must be potentially provided for one and the same product. In order to avoid this extremely involved method, only sample-like tests are often carried out as a result thereof, so that a degradation of the produced merchandise results.

Due to the individual tests running at the same time, the total duration for testing a test piece is equal to the time outlay for the longest individual test. If specific individual tests can only run sequentially as a result of their manner, the time span for the longest lasting combination is to be used. In any case, time is saved vis-à-vis purely sequentially running individual tests.

Field bus systems are particularly suitable for the communication between the control computer and the test modules or, respectively, for the communication of the test modules among one another, for example for chronologically synchronizing specific sub-tests. Furthermore, field bus systems are extremely secure regarding interferences and possibly occurring errors can be easily localized due to the bus structure. Embodiments of a field bus system are the professional bus or the CAN bus, for example. In addition to the already mentioned advantages, the ease of modifying an already existing test system, which is frequently required in practical operation, plays a deciding role. As a result of the bus structure, addresses of the test modules are freely definable and are available in large numbers.

Field bus systems primarily work with electrical signals, whereby it is also conceivable to use optical transmission media or, radio transmission paths. Moreover, it is also possible to simultaneously use different embodiments of a field bus system within a test system.

According to the method and system of the present invention, the input units and output units of the test piece are tested with at least two different test modules, performing at least two different functions. The process of the test is controlled by a control program running in a central control computer.

A particularly advantageous embodiment of the invention provides a method, wherein the control program running in the central control computer comprises a user-specific part and this user-specific part of the control program is independent of the test modules and transport modules that are connected to the central control computer.

The author of a rule controlling the test process does not need detailed knowledge about the structure of the test system, since only global indications must be made for this part of the program running in the control computer. The adaptation to the actual givens ensues separately from this independent test rule. In this way, one and the same program can be utilized unmodified for a test process in a production line or given an individual testing position. Furthermore, the test system can be easily modified in this respect, for example an exchange of a test module against a more modern one, since only the device-specific part of the program running in the central control computer is subject to this modification.

It is also advantageous to have the test modules and transport modules connected to the central control computer be recognized with the aid of the control program running in the central control computer when these are integrated into the test process according to their type. Necessary adaptations of the user-specific part of the control program, which is independent of the test modules and transport modules connected to the central control computer, are carried out automatically by the control program in the control computer. In this way, a maximum of user friendliness is achieved.

Different configurations of test modules are automatically recognized and thus can be driven by the same test rule. Whether the test system is a part of a production line or whether an individual testing position is under test is also automatically taken into consideration. Failure of a test module does not lead to the failure of the test system, since the other individual tests can be carried out without a limitation, so long as they are not dependent on the inoperative test module.

Necessary adaptations can be carried out during the runtime of the control program as well, so that it is not necessary to newly start the test system.

A beneficial embodiment of the method of the present invention provides that the structure of the test piece can be recognized with the aid of the control program running in the central control computer and the test process is correspondingly adapted. This method is particularly advantageous when devices having a different construction but have common features are to be tested. For example, two identical mobile telephones, which only differ in the utilized standard of the radio interface, can be tested by the same control program. The control program recognizes the utilized standard and correspondingly adapts the respective individual test. Meanwhile, the remaining part of the test continues unmodified.

Furthermore, the method and system of the present invention causes the control program to prepare a report about the results of the test and forward this report to an external data network. External data networks can be local area networks (LANs), or can be the Internet. It is also conceivable according to the method and system of the present invention, to transmit a test report via wire-bound telephone networks or mobile radio networks. Such a report can be locally further processed completely and independently of the test system.

Since the individual test reports are continuously controlled, any degradation in quality of the tested apparatuses can easily be recognized early, and the production process can be stopped on time or can be changed to increase quality of the devices produced.

It is also possible that the test report can automatically be forwarded to the buyer of the produced and checked technical devices.

It is also advantageous that when disturbances in the test process occur, the disturbances can be recognized by the central control computer and the test modules connected thereto. Thus, when a report is prepared corresponding to the occurred disturbance, the report can be forwarded into an external data network.

Two aspects of the method and system of the present invention are particularly important. On one hand, the user of the test system can be informed about possibly disturbances as they occur in order to be able to implement counter-measures early, particularly when the test system is integrated into a production line.

On the other hand, the producer of the test system can also be automatically informed about occurred errors directly relating to the test system itself. The presence of the user at the location is not necessarily required, so that it is possible for him to take care of other activities in addition to the monitoring of the test process.

Thus, the user can recognize errors early, can potentially eliminate them and can increase the satisfaction of his customer in a particularly efficient way. In the alternative, necessary measures for eliminating the error can be reduced to a minimum. Besides, a specific receiver or a group of receivers can be allocated to a specific disturbance in order to directly inform the responsible development engineer about an occurred interference.

External data networks are local area networks, the internet, wire-bound telephone networks or mobile radio networks, for example. The notification is based upon use of conventional data formats, for example, e-mail in the case of classic data networks, or by short message service (SMS), mobile radio networks or wireless application protocol (WAP).

For implementing the method and system of the present invention, test modules are connected via a field bus system to a central control computer. The test modules comprise interfaces with respect to input units and output units of the test piece. In contrast to the traditional wiring, whereby a separate two-wire line is provided for each test module between the test module and the central control computer or, a single-wire line given a common mass, a significant simplification in the structure of the test system is achieved as a result of the bus system. Moreover, it is easy to modify an existing test system or to eliminate an occurred interference if necessary.

The central control computer comprises an interface for connection to data networks. External data networks are local area networks, the Internet, wire-bound telephone networks or mobile radio networks. The interface makes it possible to access the test system from each arbitrary location.

The central control computer further comprises an interface to a transport module, which transports a test piece to or away from the test modules. In this way, integration of the test system into a production line is possible. Utilization of a transport module can also be expedient with respect to individual testing positions when the feeding or carrying-off of the test pieces to the test modules is dangerous for example, or can only be handled under difficult circumstances.

SUMMARY OF THE INVENTION

Accordingly, it is an object of the present invention is to provide a method and system which makes it possible to check test pieces in an efficient way.

It is another object of the invention to provide a method and system wherein implementation of a test occurs at least partially parallel in terms of time by means of at least two different test modules.

It is a further object of the invention to provide a method and system wherein transmission of test orders from the central processor to a test module and acknowledgment messages from the test module to the central control computer are carried via a field bus system.

It is an additional object of the invention to provide a method and system, wherein the control program running in the central control computer comprises a user-specific part that is independent of test modules and transport modules connected to the central control computer.

It is yet a further object of the invention to provide a method and system, wherein the structure of a test piece can be recognized with the aid of a control program running in a central control computer and the test process is correspondingly adapted.

It is yet an additional object of the invention to provide a method and system, wherein disturbances in the test process are recognized by a central control computer and test modules connected thereto, a report can be prepared corresponding to the disturbance and the report forwarded to an external data network.

These an other objects of the invention will become apparent from careful review of the following detailed description of the preferred embodiments, which is to be read in conjunction with a review of the accompanying drawing figures.

DETAILED DESCRIPTION OF THE PREFERRED EMBODIMENTS

Figure 1:
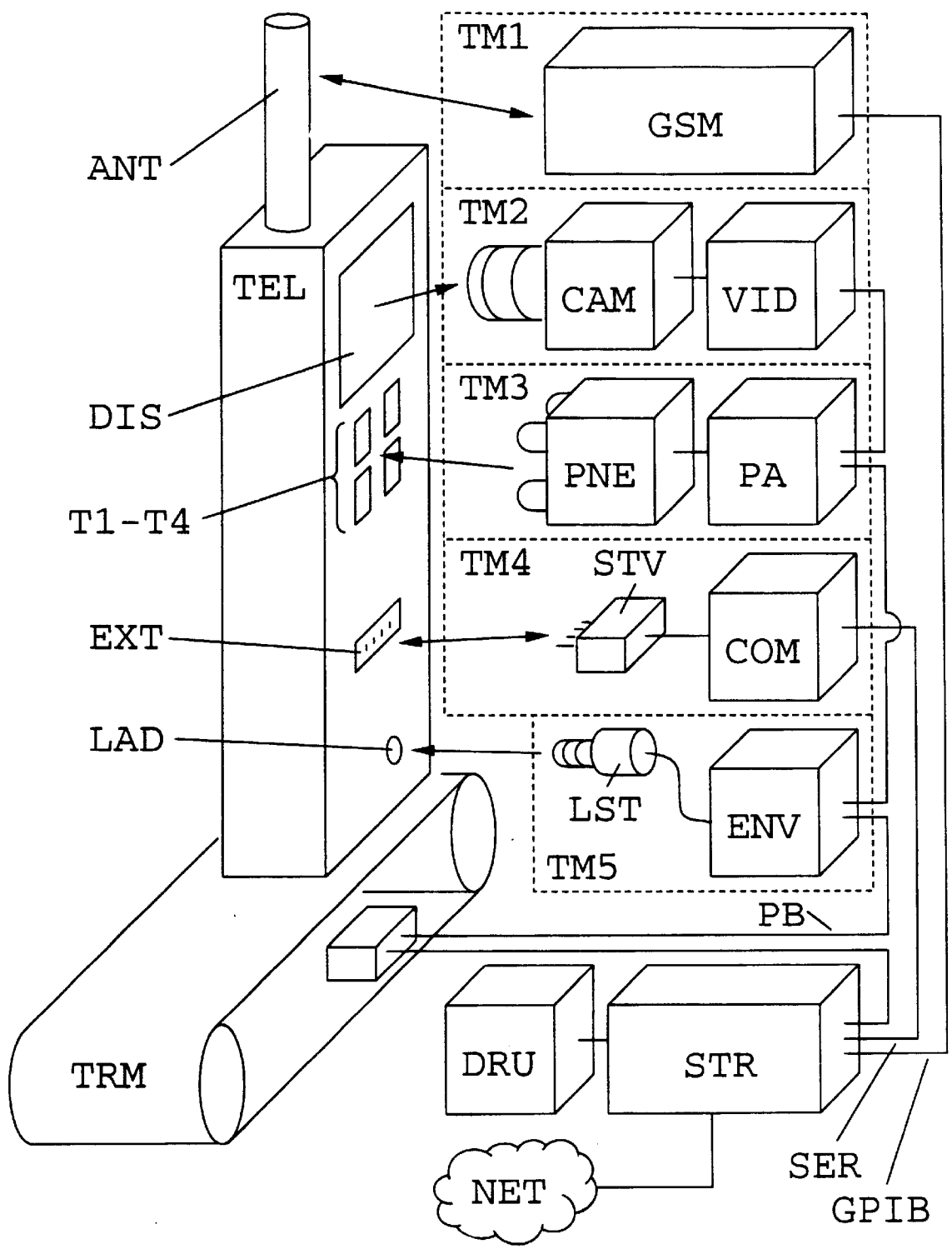
FIG. 1 shows the method and system of the present invention.

Turning now to FIG. 1, the main elements of the present invention are a test piece TEL, a transport module TRM, a first through fifth test modules TM1–TM5 and a central control computer STR.

As an example, a mobile telephone TEL is provided as the test piece. The mobile telephone TEL comprises an antenna ANT, a display unit DIS, a first through fourth input key T1 . . . T4, an external interface EXT and a load socket LAD. The external interface EXT and the load socket LAD, contrary to the conventional structural shape, are situated at the front side of the test piece TEL in order to achieve a clear representation.

In this example, the transport module TRM comprises a conveying belt, which transports the test piece TEL to and away from the test modules TM1–TM5. the transport module TRM comprises an interface for connection to a field bus system, to a professional bus PB.

The first test module TM1 is composed of a mobile radio testing device GSM for testing the radio interface of the test piece TEL via the antenna ANT. This testing device comprises an interface to a general purpose interface bus GPIB, a parallel bus system representing the standard in the measuring-technical data transmission.

The second test module TM2 comprises a video camera CAM for observing the display unit DIS of the test piece TEL and an image processing module VID, which is connected thereto and which contains an interface to a professional bus PB.

The third test module TM3 is composed of a pneumatic unit PNE and a pneumatic terminal unit PA, which is connected thereto and which enables the connection to a professional bus PB. The pneumatic unit PNE comprises four pneumatically operated rams, which can respectively activate one of the first through fourth key T1–T4 of the test piece TEL. The fourth test module comprises a plug connection STV enabling the connection of a communication unit COM connected therewith to the external interface EXT of the test piece TEL.

The communication unit COM has an interface to a serial data connection SER. The fifth test module TM5 is composed of a load plug LST and of an energy supply module ENV, which is connected to the load plug LST, and comprises an interface to the professional bus. The load plug LST enables the connection between the load socket LAD of the test piece TEL and the energy supply module ENV.

The central control computer STR comprises interfaces to two different field bus systems, the professional bus PB and the general purpose bus GPIB. Furthermore, the central control computer contains a connection to an external data network NET, a connection to a printer DRU and an interface to a serial data connection SER.

The first test module TM1 is connected via a general purpose interface bus GPIB to the central control computer STR. The connection of the transport module TRM, of the second test module TM2, of the third test module TM3 and of the fifth test module TM5 to the central control computer STR ensues via a professional bus PB, which connects the individual modules to one another in a chain-like fashion. The fourth test module TM4 is connected via a serial data connection SER to the central control computer STR.

FIG. 1 symbolically shows the flow via arrows. On one hand, a bi-directional connection is present between the first test module TM1 and the antenna ANT and, on the other hand, between the fourth test module TM4 and the external interface EXT of the test piece TEL. The display unit DIS can only transmit bits of information to the second test module TM2 and not vice versa. The first through fourth key T1–T4 of the test piece TEL can only be operated by the respective ram of the pneumatic unit PNE of the third test module TM3. The fifth test module TM5 merely acquires the load current flowing into the load socket LAD, so that the arrow points from the test module TM5 in the direction of the load socket LAD of the test piece TEL.

The present arrangement is analyzed by a control program running in the central control computer STR and the test process is adapted to the connected modules. Since the shown arrangement is a test system that is integrated into a production line, the control program transmits a command to the transport module TRM—to transport a test piece TEL to the first through fifth test module TM1 . . . TM5 such that the following test can be carried out.

The transport module TRM executes this command and sends a confirmation therefore to the central control computer STR. Communication between the transport module TRM and the central control computer STR is carried out using the professional bus PB.

Since different types of test pieces TEL are tested with the arrangement shown in FIG. 1, the central control computer STR sends a command to the second test module TM2 to analyze the product name of the test piece TEL. The second test module TM2 transmits the result to the central control computer STR after the product type has been determined.

It is also conceivable that bits of information about the structure of the present product type are received via the external data network NET. On the basis of the control program running in the central control computer STR, the test process is now adapted corresponding to the product type to be tested. The test rule composed by the quality securing staff is so far decoupled from the actual givens that these remain untouched by the occurred adaptations.

After the structure of all connected modules and the type of the test piece TEL have been determined, the actual test is started with the aid of the control program. First, the control program initiates the fourth test module TM4 to set up the connection between the external interface EXT of the test piece TEL and the plug device STV. Analogously, a corresponding command is transmitted from the central control computer to the fifth test module TM5—to connect the load plug LST to the load socket LAD of the test piece TEL.

Thereupon, the central control computer STR sends commands to the first through fifth test module TM1–TM5—to now start with the individual tests. Two test loops are formed in the shown example. Given the first test loop, the third test module TM3 operates the first through fourth key T1–T4 of the test piece TEL with the aid of the rams of the pneumatic unit PNEU. The respectively pushed key is represented at the display unit DIS and is evaluated by the second test module TM2. The second test loop starts at the fourth test module TM4, via which a data pattern is transmitted to the external interface EXT of the test piece TEL.

This data pattern is emitted via the antenna ANT with the aid of an operating system running in the test piece TEL and is received by the first test module TM1. The second test loop can basically run in reversed order as well, whereby the first test module TM1 sends a data pattern via the antenna ANT to the radio interface of the test piece TEL and it is transmitted via the external interface EXT to the fourth test module TM4. In the shown example, the fifth test module merely monitors the load current of the energy supply module ENV. The two test loops, as well as the monitoring of the load current occur independently of one another and therefore occur at the same time.

In order to further support the parallel process of the individual tests, a test modus designed for this purpose can be provided in the operating system of the test piece TEL.

The second test module TM2 and the third test module TM3 can also communicate with one another via the professional bus PB without integration of the central control computer STR.

In order to complete the test of the display unit DIS, a test loop is finally formed between the fourth test module TM4, the test piece TEL and the second test module TM2. The operating system of the test piece TEL thereby transmits a data pattern, which is sent by the fourth test module TM4 to the external interface EXT, to the display unit DIS. The displayed patterns, which are specifically oriented to the test of the display unit DIS, are finally evaluated by the second test module TM2.

The confirmation regarding the executed command and the results of the individual tests are chronologically asynchronously transmitted by the respective test modules to the central control computer STR. These bits of information are collected with the aid of the control program running in the central control computer STR and are put together to an overall report. This report is forwarded via the external data network NET to a receiver defined in the control program, for example to a centrally led database for storing data, which are important for assuring the quality.

In case of a disturbance in the test process, the corresponding module informs the central control computer STR thereof, particularly when the disturbance cannot be eliminated by the module itself. On the basis of the control program running in the central control computer STR, further measures are subsequently initiated, possibly the transmission of a corresponding interference message to a receiver defined in the control program via the external data network NET.

After the test has been completed, the central control computer STR transmits a command to the transport module TRM to transport the tested test piece TEL away from the first through fifth test module TM1–TM5 and to supply a new test piece TEL. The cycle begins again at this point and continues in the described way.

Dividing of the tasks corresponding to the shown example is not binding. Rather, the individual tasks can be assigned to the central control computer STR and to the modules connected thereto such that an optimal overall effect is obtained.

This optimization can be conducted based upon an optimally short total testing time or a mostly complete test concerning the function of the test piece TEL can be conducted.

Although modifications and changes may be suggested by those skilled in the art to which this invention pertains, it is the intention of the inventor to embody within the patent warranted hereon, all changes and modifications that may reasonably and properly come under the scope of his contribution to the art.

What is claimed is:

1. A method for performing a test on an electronic device having input units and output units which are tested with at least two different test modules that perform at least two different functions, the method comprising the steps of:

controlling the test by a control program running in a central control computer;

connecting test modules and transport modules to the central control computer;

implementing the test by the at least two different test modules running at least partially in parallel in terms of time transmitting test orders from the central control computer to a test module; and acknowledging messages from the test module to the central computer via a field bus system.

2. The method according to claim 1, further comprising the step of:

running in the control program a user-specific part that is independent of the test modules and the transport modules.

3. The method according to claim 2, further comprising the steps of:

recognizing the test modules and transport modules with the aid of the control program; and integrating the modules into the test process corresponding to their type.

4. The method according to claim 3, further comprising the steps of:

recognizing the structure of the test piece with the aid of the control program; and adapting the test process correspondingly.

5. The method according to claim 4, further comprising the steps of:

having the control program prepare a report about the result of a test; and forwarding the report into an external data network.

6. The method according to claim 5, further comprising the steps of:

recognizing disturbances in the test process by the central control computer and the test modules connected thereto;

preparing a report corresponding to the disturbances; and forwarding the report is forwarded into an external data network.

7. A system for testing an electronic device, wherein input units and output units of the device are tested, the system comprising:

a central computer, at least two test modules and a field bus system connecting the test modules to the central control computer, whereby the test modules concerning at least two different functions, operate as interfaces to the input units and output units, and are configured to run at least partially in parallel in terms of wherein the central control computer comprises an interface to a data network; and wherein the central control computer comprises an interface to a transport module, which transports a test piece to and from the test modules.

* * * * *